(12) United States Patent
Jeon et al.

(10) Patent No.: US 8,354,908 B2
(45) Date of Patent: Jan. 15, 2013

(54) CYLINDRICAL MAGNETIC LEVITATION STAGE

(75) Inventors: Jeong Woo Jeon, Changwon-si (KR); Hyun Seok Oh, Suwon-si (KR); Sung Il Chung, Pohang-si (KR); Yeon Ho Jeong, Changwon-si (KR); Do Hyun Kang, Changwwon (KR); S. A. Nikiforov, Pohang-si (KR); Mitica Caraiani, Pohang-si (KR)

(73) Assignee: Korea Electrotechnology Research Institute, Gyeongsangnam-do (KR)

( * ) Notice: Subject to any disclaimer, the term of this patent is extended or adjusted under 35 U.S.C. 154(b) by 44 days.

(21) Appl. No.: 13/001,752

(22) PCT Filed: Sep. 29, 2008

(86) PCT No.: PCT/KR2008/005733
§ 371 (c)(1),
(2), (4) Date: Apr. 1, 2011

(87) PCT Pub. No.: WO2010/002071
PCT Pub. Date: Jan. 7, 2010

(65) Prior Publication Data
US 2011/0234343 A1 Sep. 29, 2011

(30) Foreign Application Priority Data
Jul. 4, 2008 (KR) .................. 10-2008-0065102

(51) Int. Cl.
*H01F 7/00* (2006.01)

(52) U.S. Cl. ........ 335/229; 335/266; 335/268; 335/279; 335/281; 335/284; 335/296; 335/299; 335/300; 335/306; 310/90.5; 310/179

(58) Field of Classification Search .................. 335/219, 335/229, 266, 268, 279, 281, 284, 296, 299–300, 335/306; 310/12.19, 12.22, 12.25, 90.5, 310/258, 179
See application file for complete search history.

(56) References Cited

U.S. PATENT DOCUMENTS

| | | | | |
|---|---|---|---|---|
| 3,149,255 A | * | 9/1964 | Trench | 310/30 |
| 5,182,533 A | * | 1/1993 | Ritts | 335/306 |
| 5,506,459 A | * | 4/1996 | Ritts | 310/90.5 |
| 5,896,076 A | * | 4/1999 | van Namen | 335/229 |
| 6,130,494 A | * | 10/2000 | Schob | 310/90.5 |
| 6,320,290 B1 | | 11/2001 | Kanebako et al. | |
| 6,960,847 B2 | * | 11/2005 | Suzuki et al. | 310/14 |
| 7,504,921 B2 | * | 3/2009 | Vranish | 335/302 |
| 2002/0093252 A1 | * | 7/2002 | Kang et al. | 310/12 |

FOREIGN PATENT DOCUMENTS

JP 2002-329764 A 11/2002

(Continued)

*Primary Examiner* — Mohamad Musleh
(74) *Attorney, Agent, or Firm* — Frommer Lawrence & Haug LLP; Ronald R. Santucci (57) ABSTRACT

The present invention provides a cylindrical magnetic levitation stage which includes a cylindrical substrate used to form micro-patterns of various arbitrary shapes on a large-area semiconductor substrate or display panel substrate, a cylindrical substrate, a combination of a first permanent magnet array and a first coil array and a combination of a first permanent magnet array and a first coil array, which are coupled to the cylindrical substrate, so that levitation, axial translation and rotation of the cylindrical substrate can be made finely through the control of a magnetic force generated by the interaction between a magnetic field generated by electric current applied to the coil arrays and a magnetic field generated from the permanent magnet arrays corresponding to the coil arrays.

32 Claims, 4 Drawing Sheets

| FOREIGN PATENT DOCUMENTS | | | KR | 10-2001-0061827 | 7/2001 |
|---|---|---|---|---|---|
| KR | 10-2000-0074216 | 12/2000 | | | |
| KR | 10-0293316 B | 4/2001 | * cited by examiner | | |

CYLINDRICAL MAGNETIC LEVITATION STAGE

This application is a 371 of PCT/KR2008/005733 field on Sep. 29, 2008 published on Jan. 7, 2010 under publication number WO 2010/002071 A which claims priority benefits to Korean Paatent Application Number 10-2008-0065102 field Jul. 4, 2008, the disclosure of which is incorporated herein by reference.

TECHNICAL FIELD

The present invention relates to a cylindrical magnetic levitation stage, and more particularly to a cylindrical magnetic levitation stage in which in the case where a cylindrical substrate is used to form micro-patterns of various arbitrary shapes on a large-area semiconductor substrate or display panel substrate, axial translation and rotation of the cylindrical substrate can be finely controlled through a non-contact manner employing a magnetic levitation principle that can be applied to an exposure apparatus and an exposure work to form the micro-patterns on the surface of the cylindrical substrate.

BACKGROUND ART

In a lithography process as one of manufacture processes of devices such as semi-conductor devices, liquid crystal display (LCD) panel and the like, the exposure apparatus is used to transcribe pattern images on a wafer or a glass plate as a substrate applied with a photoresist.

A photolithography as a kind of photo-micromachining technique which forms a micro-pattern on a desired portion of the wafer substrate using a light source refers to a process in which light is passed through a mask having a circuit pattern which it is desired to form on the wafer, and geometric patterns on the mask is transferred to a light-sensitive chemical, i.e., the photoresist.

Conventionally, since an exposure substrate is formed of a flat plate type such as a wafer or a glass plate, a planar-type stage corresponding to the size of the wafer or glass plate is required to perform an exposure work on a large-area substrate. However, a high-precision exposure apparatus is required along with micronization of a circuit pattern due to a trend toward miniaturization and large-capacitance. Thus, a conventional planar-type stage encounters a limitation in coping with such a trend.

Particularly, in the case where the exposure work should be carried out in a vacuum environment, a stage for translation of the wafer or the glass plate should be also applied to the vacuum environment. However, since most of stages for use in the vacuum environment use a contact-type mechanical bearing, there is a limitation in making high precision of the exposure apparatus possible due to friction. In addition, even a non-contact type air levitation bearing applicable to the vacuum environment entails a problem in that it can be applied to only a low-vacuum environment.

DISCLOSURE OF INVENTION

Technical Problem

The present invention has been made in an effort to solve the above problems occurring in the prior art, and it is an object of the present invention to provide a cylindrical magnetic levitation stage in which the shape of the substrate is converted into a cylindrical shape in consideration of a problem that a conventional planar-type stage has a limitation in making the substrate large-scale as corresponding to the size of the wafer or glass plate, and which can be used for the large-scaling of the substrate and high-precision of the exposure apparatus as well as in an vacuum environment by employing a non-contact type magnetic levitation principle so as to perform a high-precision control for the formation of micro-patterns on the surface of the cylindrical substrate.

Technical Solution

In order to accomplish the above object, the present invention provides the following configurations.

In one aspect, the present invention provides a cylindrical magnetic levitation stage comprising: a cylindrical substrate; a first cylindrical substrate holder and a second cylindrical substrate holder coupled to both ends of the cylindrical substrate; a first mover and a second mover onto which a first permanent magnet array and a second permanent magnet array are attached, respectively; a first coupling section and a second coupling section for connecting the first and second movers to the first and second cylindrical substrate holders, respectively, so as to allow the first mover and the first cylindrical substrate holder to be operated in cooperation with each other and the second mover and the second cylindrical substrate holder to be operated in cooperation with each other; and a first stator and a second stator disposed below the first permanent magnet array and the second permanent magnet array, respectively, with a first coil array and a second coil array interposed between the first and second permanent magnet arrays and the first and second stators, respectively.

Also, the first cylindrical substrate holder and the second cylindrical substrate holder can be coupled to and separated from both ends of the cylindrical substrate, and the first permanent magnet array and the second permanent magnet array are attached along the cylindrical surfaces of the first mover and the second mover, respectively.

In the present invention, when an arbitrary external force is applied to the first permanent magnet array and the second permanent magnet array, it is sequentially transferred to the first mover and the second mover, the first coupling section and the second coupling section, the first cylindrical substrate holder and the second cylindrical substrate holder, and the cylindrical substrate, respectively, in this order so that the cylindrical substrate can be finely fed and rotate. To this end, when electric current is inputted to the first coil array and the second coil array, a magnetic field is generated from each of the surfaces of the first coil array and the second coil array so that a magnetic force is generated by the interaction between the generated magnetic field and the magnetic field generated from each of the first permanent magnet array and the second permanent magnet array, and the generated magnetic force is controlled to be applied to the first permanent magnet array and the second permanent magnet array.

Thus, when the generated magnetic force is controlled, the first permanent magnet array and the second permanent magnet array are levitated in a non-contact manner so as to effect the fine axial translation and rotation of the first permanent magnet array and the second permanent magnet array.

In the present invention, the magnetic force generated by the interaction between the magnetic fields of the first permanent magnet array and the first coil array generates the levitation force acting in a vertical direction relative to an axis of the cylindrical substrate and the rotational force acting in a rotational direction relative to the axis of the cylindrical substrate. Also, the magnetic force generated by the interaction between the magnetic fields of the second permanent magnet array and the second coil array generates the levitation force acting in a vertical direction relative to an axis of the cylindrical substrate and the translation force acting in the axial direction of the cylindrical substrate.

Thus, the interactions between the respective magnetic fields of the first permanent magnet array and the second permanent magnet array and the respective magnetic fields of the first coil array and the second coil array generate the levitation force acting in a vertical direction relative to an axis of the cylindrical substrate between the permanent magnet arrays and the coil arrays, the rotational force acting in a rotational direction relative to the axis of the cylindrical substrate, and the translation force acting in the axial direction of the cylindrical substrate. Also, the levitation, the rotation and the axial translation of the cylindrical substrate can be finely effected in a non-contact manner using the levitation force, the rotational force and the translation force generated by the interactions between the first permanent magnet array and the second permanent magnet array and the first coil array and the second coil array.

The first permanent magnet array is formed in a cylindrical shape while forming the "Halbach array" consisting of a row of bar-like permanent magnet segments having different four magnetization directions, i.e., a permanent magnet segment A, a permanent magnet segment B, a permanent magnet segment C, and a permanent magnet segment D.

In addition, the first permanent magnet array formed in the cylindrical shape is attached along the cylindrical surface of the first mover, and the first coil array is configured such that first coil segments each having a magnetic field-generating surface of a planar shape are arranged in an arcuate shape.

Accordingly, the interaction between the respective magnetic fields generated from the first permanent magnet array and the first coil array generates the levitation force acting in a vertical direction relative to an axis of the cylindrical substrate and the rotational force acting in a rotational direction relative to the axis of the cylindrical substrate, and the cylindrical substrate can be levitated and rotate finely by using the generated levitation force and rotational force.

The cylindrical magnetic levitation stage according to claim 1, wherein the second permanent magnet array is formed in a cylindrical shape while forming the "Halbach array" consisting of a row of arcuate-shaped permanent magnet segments having different four magnetization directions, i.e., a permanent magnet segment E, a permanent magnet segment F, a permanent magnet segment G, and a permanent magnet segment H.

In addition, the second permanent magnet array formed in the cylindrical shape is attached along the cylindrical surface of the second mover, and the second coil array is configured such that second coil segments each having a magnetic field-generating surface of an arcuately-concaved shape are arranged in an arcuate shape.

Accordingly, the interaction between the respective magnetic fields generated from the second permanent magnet array and the second coil array generates the levitation force acting in a vertical direction relative to an axis of the cylindrical substrate and the translation force acting in the axial direction of the cylindrical substrate, and the cylindrical substrate can be levitated and fed finely by using the generated translation force.

Further, the permanent magnet segment A, the permanent magnet segment B, the permanent magnet segment C, the permanent magnet segment D, the permanent magnet segment E, the permanent magnet segment F, the permanent magnet segment G and the permanent magnet segment H, which constitute the first permanent magnet array and the second permanent magnet array, are mixedly assembled to form a cylindrical shape in the two-dimensional Halbach array, so that the first permanent magnet array and the second permanent magnet array can be configured in the same structure.

In this case, the first permanent magnet array is attached along the cylindrical surface of the first mover, and the second permanent magnet array is attached along the cylindrical surface of the second mover. Also, the first coil array and the second coil array are configured such that six first coil segments form one set and six second coil segments form one set, and then the coil segments of each set are mixedly arranged in a two-dimensional pattern to take an arcuate shape.

In addition, the magnetic force generated by the interaction between the respective magnetic fields of the first permanent magnet array and the first coil array simultaneously generates the levitation force acting in a vertical direction relative to an axis of the cylindrical substrate, the rotational force acting in a rotational direction relative to an axis of the cylindrical substrate and the translation force acting in the axial direction of the cylindrical substrate, as well as the magnetic force generated by the interaction between the respective magnetic fields of the second permanent magnet array and the second coil array simultaneously generates the levitation force acting in a vertical direction relative to an axis of the cylindrical substrate, the rotational force acting in a rotational direction relative to an axis of the cylindrical substrate and the translation force acting in the axial direction of the cylindrical substrate.

Further, the present invention provides a cooling apparatus for a cylindrical magnetic levitation stage, comprising: a first stator; a cooling fin disposed on the first stator for performing a heat exchange; and a refrigerant circulating loop including a cooling tube mounted inside the first stator, a refrigerant inlet tube and a refrigerant outlet tube.

Also, the present invention provides a cooling apparatus for a cylindrical magnetic levitation stage, comprising: a second stator; a cooling fin disposed on the second stator for performing a heat exchange; and a refrigerant circulating loop including a cooling tube mounted inside the second stator, a refrigerant inlet tube and a refrigerant outlet tube.

In this case, a plurality of cooling fins is arranged at regular intervals on the first stator or the second stator, a first coil array or a second coil array is insertedly coupled between the cooling fins, and the first coil array or the second coil array is bonded to the cooling fins such that the lateral surface of the first coil array or the second coil array is completely brought into close contact with the lateral surfaces of the cooling fins. When electric current is inputted to the first coil array or the second coil array, heat is generated from the first coil array or the second coil array depending on the strength of the electric current and is transmitted to the first stator or the second stator via the cooling fins.

Accordingly, a rise in temperature of the first or second stator and the first or second coil array is suppressed as the heat transmitted to the first stator is emitted along with the flow of the refrigerant through the cooling tubes formed in the first stator or the second stator.

Moreover, in case where there occurs any movement of the first stator or the second stator, a fixed-type bent tube is coupled to the first stator to securely fix the refrigerant inlet tube and the refrigerant outlet tube in the refrigerant circulating loop so as to maintain perpendicularity and parallelism between the refrigerant inlet tube/the refrigerant outlet tube and the first stator or the second stator.

Advantageous Effects

As described above, the cylindrical magnetic levitation stage according to the present invention has the following advantageous effects.

First, since the cylindrical substrate is used instead of a conventional planar substrate, it is easy to cope with a mass-production of a large-area high precision roll to roll, which contributes to large-scaling of the substrate.

Second, since the use of the magnetic levitation principle of the non-contact manner can control fine axial translation and rotation of the cylindrical substrate, it is easy to create micro-patterns on the cylindrical substrate and high-integration of the device through high-precision control is possible.

Third, since the magnetic levitation principle is used, the fine axial translation and rotation of the cylindrical substrate can be controlled even in a vacuum environment.

BRIEF DESCRIPTION OF DRAWINGS

The above and other objects, features and advantages of the present invention will be apparent from the following detailed description of the preferred embodiments of the invention in conjunction with the accompanying drawings, in which.

Reference numerals set forth in the Drawings includes reference to the following elements as further discussed below:

10: cylindrical substrate 25: cooling tube
11: first cylindrical substrate holder
12: second cylindrical substrate holder
13: first coupling section 14: second coupling section
21: first permanent magnet array
21-a: permanent magnet array A
21-b: permanent magnet array B
21-c: permanent magnet array C
21-d: permanent magnet array D
22: first coil array 23: first mover
31: second permanent magnet array
31-a: permanent magnet array E
31-b: permanent magnet array F
31-c: permanent magnet array G
31-d: permanent magnet array H
32: second coil array 33: second mover
41: first stator 51: second stator

MODE FOR THE INVENTION

Reference will now be made in detail to the preferred embodiment of the present invention, examples of which are illustrated in the drawings attached hereinafter, wherein like reference numerals refer to like elements throughout. The embodiments are described below so as to explain the present invention by referring to the figures.

In order to accomplish the above objects, the present invention provides a cylindrical magnetic levitation stage which includes a cylindrical substrate used to form micro-patterns of various arbitrary shapes on a large-area semiconductor substrate or display panel substrate, a cylindrical substrate, a combination of a first permanent magnet array and a first coil array and a combination of a first permanent magnet array and a first coil array, which are coupled to the cylindrical substrate, so that levitation, axial translation and rotation of the cylindrical substrate can be made finely through the control of a magnetic force generated by the interaction between a magnetic field generated by electric current inputted to the coil arrays and a magnetic field generated from the permanent magnet arrays corresponding to the coil arrays.

Now, a preferred embodiment of the present invention will be described in detail with reference to the accompanying drawings.

Figure 1:
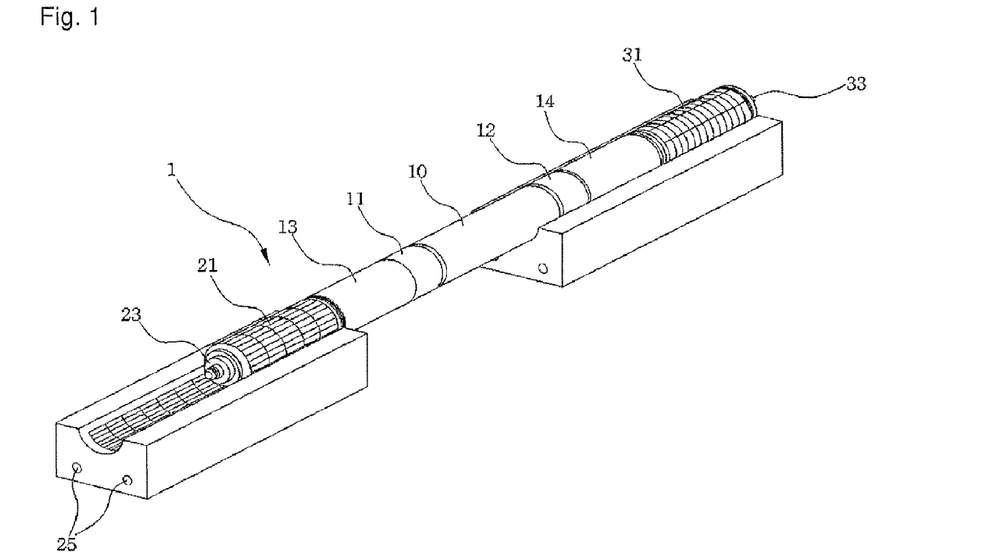
FIG. 1 is a perspective view showing the entire construction of a cylindrical magnetic levitation stage according to the present invention.

As a preferred embodiment of the present invention, FIG. 1 is a perspective view showing the entire construction of a cylindrical magnetic levitation stage according to the present invention. As shown in FIG. 1, the cylindrical magnetic levitation stage 1 includes a cylindrical substrate 10, a first cylindrical substrate holder 11 and a second cylindrical substrate holder 12 coupled to both ends of the cylindrical substrate 10, a first permanent magnet array 21 and a second permanent magnet array 31 coupled to a first mover 23 and a second mover 33, respectively, a first coupling section 13 and a second coupling section 14 for connecting the first and second movers to the first and second cylindrical substrate holders, respectively, and a first stator 41 and a second stator 51 disposed below the first permanent magnet array 21 and the second permanent magnet array 31, respectively, with a first coil array 22 and a second coil array 32 interposed between the first and second permanent magnet arrays and the first and second stators, respectively, so as to allow an external force to be applied to the first permanent magnet array 21 and the second permanent magnet array 31. Also, the present invention may include a cooling apparatus in which cooling tubes 25 are formed in the first and second stators so as to allow cooling water to pass therethrough to absorb heat energy generated by electric current flowing in the coils of the coil arrays.

Figure 2:
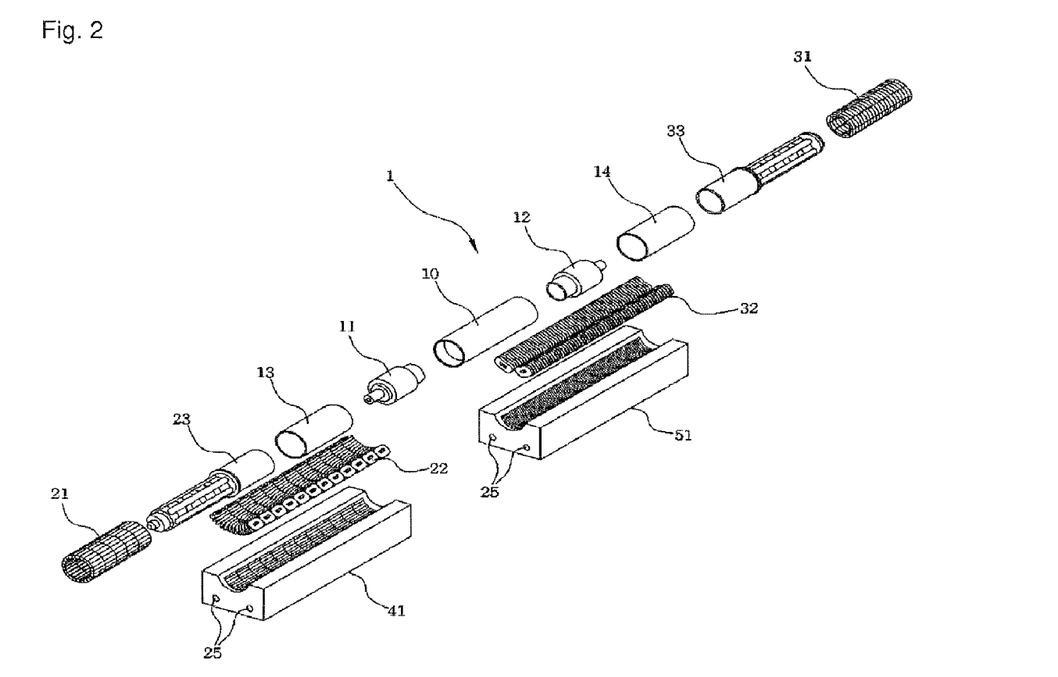
FIG. 2 is an exploded perspective view showing the entire construction of a cylindrical magnetic levitation stage according to the present invention.

FIG. 2 is an exploded perspective view showing the entire construction of a cylindrical magnetic levitation stage according to the present invention in which the coupling relationship between respective elements is shown.

As shown in FIG. 2, the cylindrical magnetic levitation stage 1 is configured such that the cylindrical substrate 10 for performing an exposure work is detachably coupled to a pair of cylindrical substrate holders, i.e., the first cylindrical substrate holder 11 and the second cylindrical substrate holder 12 for fixedly mounting the cylindrical substrate. In addition, the pair of movers, i.e., the first mover 23 and the second mover 33 are arranged in an coaxial direction relative to the cylindrical substrate, and the pair of permanent magnet arrays are attached along the cylindrical surfaces of the pair of movers. The pair of cylindrical substrate holders and the pair of movers are coupled to each other by means of the first coupling section 13 and the second coupling section 14, respectively, so as to transfer an external force applied to the pair of permanent magnet arrays to the cylindrical substrate 10 to allow the cylindrical substrate to be finely fed and rotate.

In order to apply the external force to the first permanent magnet array 21 and the second permanent magnet array 31 to effect the fine axial translation and rotation of the cylindrical substrate 10, as shown in FIG. 2, the first stator 41 and the second stator 51 are disposed below the first permanent magnet array 21 and the second permanent magnet array 31, respectively. The first stator 41 and the second stator 51 are configured to support an assembly of the cylindrical substrate and the like as well as include the first coil array and the second coil array. When electric current is inputted to the first coil array 22 and the second coil array 32, a magnetic field is generated from each of the surfaces of the first coil array 22 and the second coil array 32 so that a magnetic force is generated by the interaction between the generated magnetic field and the magnetic field generated from each of the first permanent magnet array 21 and the second permanent magnet array 31. In this case, when the generated magnetic force is properly controlled, the first permanent magnet array 21 and the second permanent magnet array 31 are levitated to be maintained in a non-contact state where the first and second permanent magnet arrays are not brought into close contact with the first and second coil arrays. In addition, when the generated magnetic force is finely controlled, the first permanent magnet array 21 and the second permanent magnet array 31 can be finely fed and rotate in the non-contact state.

With regard to the magnetic force generated from the cylindrical magnetic levitation stage 1 as shown in FIGS. 1 and 2, the magnetic force generated by the interaction between the respective magnetic fields of the first permanent magnet array 21 and the first coil array 22 generates the levitation force acting in a vertical direction relative to an axis of the cylindrical substrate as well as the rotational force acting in a rotational direction relative to an axis of the cylindrical substrate. Moreover, the magnetic force generated by the interaction between the respective magnetic fields of the second permanent magnet array 31 and the second coil array 32 generates the levitation force acting in a vertical direction relative to an axis of the cylindrical substrate as well as the translation force acting in the axial direction of the cylindrical substrate. Thus, the interactions between the respective magnetic fields of the first permanent magnet array 21 and the second permanent magnet array 31 and the respective magnetic fields 22 of the first coil array and the second coil array 32 generate the levitation force acting in a vertical direction relative to an axis of the cylindrical substrate, the rotational force acting in a rotational direction relative to the axis of the cylindrical substrate, and the translation force acting in the axial direction of the cylindrical substrate so as to finely effect the levitation, the rotation and the axial translation of the cylindrical substrate in a non-contact manner.

Figure 3:
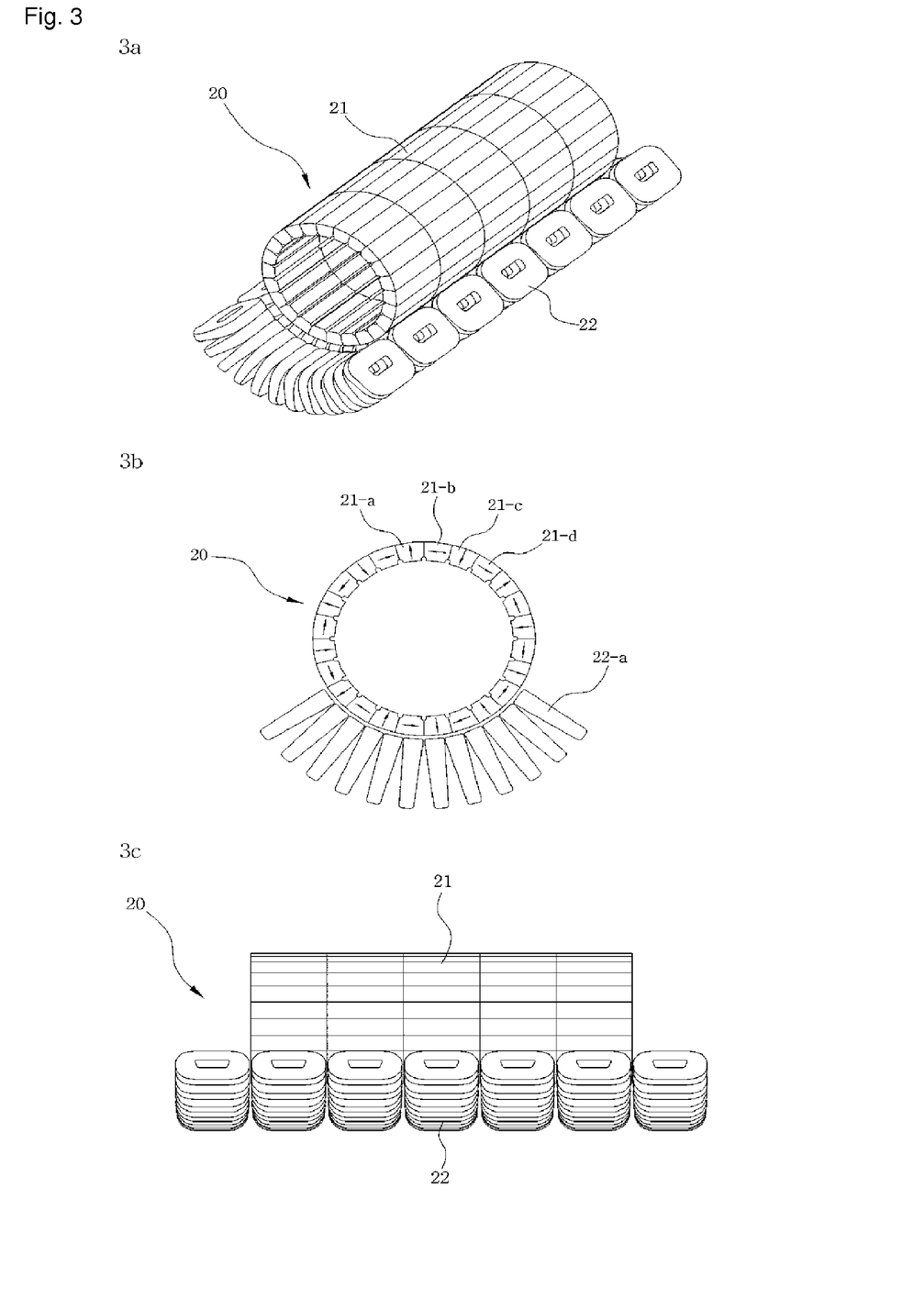
FIG. 3a is a perspective view showing the construction of a first permanent magnet array and a first coil array of a first magnetic levitation section which serves as levitation and translation of a cylindrical substrate according to the present invention.
FIG. 3b is a side view showing the construction of a first permanent magnet array and a first coil array of a first magnetic levitation section which serves as levitation and translation of a cylindrical substrate according to the present invention.
FIG. 3c is a front view showing the construction of a first permanent magnet array and a first coil array of a first magnetic levitation section which serves as levitation and translation of a cylindrical substrate according to the present invention.

FIGS. 3a to 3c are perspective, side and front views showing the construction of the first permanent magnet array 21 and the first coil array 22 of a first magnetic levitation section 20 which serves to effect levitation and rotation of a cylindrical substrate 10 according to the present invention.

As shown in FIGS. 3a to 3c, the first magnetic levitation section 20 includes the first permanent magnet array 21 and the first coil array 22. The first permanent magnet array 21 is arranged in a cylindrical shape while forming the "Halbach array" consisting of a row of bar-like permanent magnet segments having different four magnetization directions, i.e., a permanent magnet segment A 21-a, a permanent magnet segment B 21-b, a permanent magnet segment C 21-c, and a permanent magnet segment D 21-d, each oriented so that its magnetic field is at a right angle to that of the adjacent magnet segment, and the right-angle turns are sequenced. As shown in FIG. 2, the first permanent magnet array 21 is coupled to the first mover 23. Also, first coil segments 22-a in which a coil is wound to form a magnetic field-generating surface of a planar shape are arranged in an arcuate shape as shown in FIGS. 3a to 3c so as to constitute the first coil array 22. As shown in FIG. 2, the first coil array 22 is assembled with the first stator 41. The first stator 41 has grooves formed thereon so as to allow the first coil segments to be insertedly fixed thereto. Thus, when electric current is inputted to the first coil array 22, a magnetic field is generated from the first coil array 22, so that the interaction between the magnetic field generated from the first coil array 22 and the magnetic field generated from the first permanent magnet array 21 generates the levitation force acting in a vertical direction relative to an axis of the cylindrical substrate and the rotational force acting in a rotational direction relative to the axis of the cylindrical substrate. The cylindrical substrate can be levitated and rotate finely by using the generated levitation force and rotational force. Preferably, in consideration of the axial length of the first permanent magnet array and an exposure work distance of the cylindrical substrate, the length of the first stator 41 including the first coil array 22 is set to be sufficiently long so as to cope with the axial translation of the first permanent magnet array.

Figure 4:
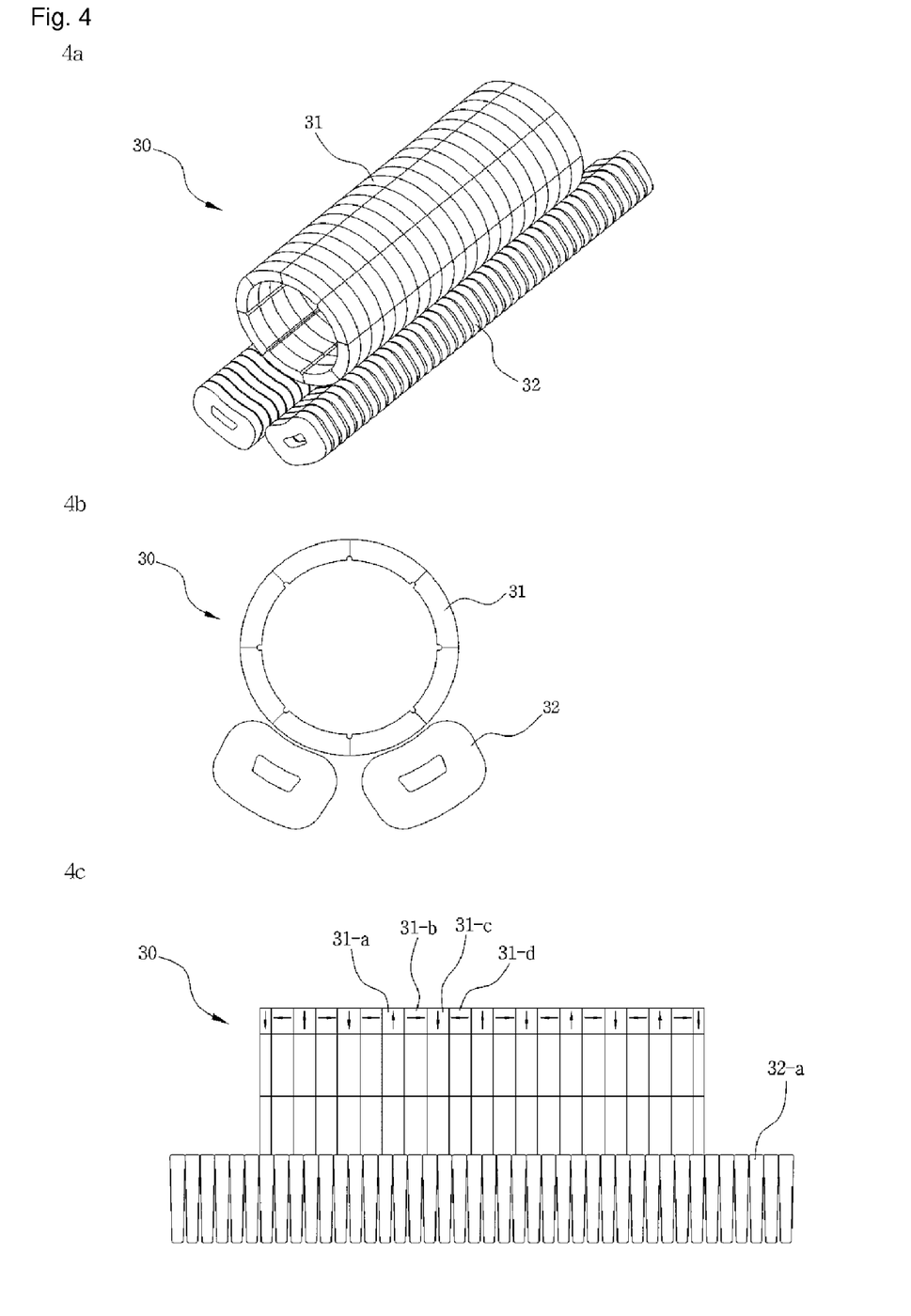
FIG. 4a is a perspective view showing the construction of a second permanent magnet array and a second coil array of a second magnetic levitation section which serves as levitation and translation of a cylindrical substrate according to the present invention.
FIG. 4b is a side view showing the construction of a second permanent magnet array and a second coil array of a second magnetic levitation section which serves as levitation and translation of a cylindrical substrate according to the present invention.
FIG. 4c is a front view showing the construction of a second permanent magnet array and a second coil array of a second magnetic levitation section which serves as levitation and translation of a cylindrical substrate according to the present invention.

FIGS. 4a to 4c are perspective, side and front views showing the construction of the second permanent magnet array 31 and the second coil array 32 of a second magnetic levitation section 30 which serves to effect levitation and axial translation of a cylindrical substrate 10 according to the present invention.

As shown in FIGS. 4a to 4c, the second magnetic levitation section 30 includes the second permanent magnet array 31 and the second coil array 32. The second permanent magnet array 31 is arranged in a cylindrical shape while forming the "Halbach array" consisting of a row of arcuate-shaped permanent magnet segments having different four magnetization directions, i.e., a permanent magnet segment E 31-a, a permanent magnet segment F 31-b, a permanent magnet segment G 31-c, and a permanent magnet segment H 31-d, each oriented so that its magnetic field is at a right angle to that of the adjacent magnet segment, and the right-angle turns are sequenced. As shown in FIG. 2, the second permanent magnet array 31 is coupled to the second mover 33. Also, second coil segments 32-a in which a coil is wound to form a magnetic field-generating surface of an arcuately-concaved shape are arranged in an arcuate shape as shown in FIGS. 4a to 4c so as to constitute the second coil array 32. As shown in FIG. 2, the second coil array 32 is assembled with the second stator 51. The second stator 51 has grooves formed thereon so as to allow the second coil segments to be insertedly fixed thereto. Thus, when electric current is inputted to the second coil array 32, a magnetic field is generated from the second coil array 32, so that the interaction between the magnetic field generated from the second coil array 32 and the magnetic field generated from the second permanent magnet array 31 generates the levitation force acting in a vertical direction relative to an axis of the cylindrical substrate and the translation force acting in the axial direction of the cylindrical substrate. The cylindrical substrate can be levitated and fed finely by using the generated levitation force and translation force. Preferably, in consideration of the axial length of the second permanent magnet array and an exposure work distance of the cylindrical substrate, the length of the second stator 51 including the second coil array 32 is set to be sufficiently long so as to cope with the axial translation of the second permanent magnet array according to the axial translation of the first permanent magnet array.

In another embodiment of the magnetic levitation section to effect the levitation, the axial translation and the rotation of the cylindrical substrate 10 in the cylindrical magnetic levitation stage of the present invention, the permanent magnet array may be configured in a two-dimensional Halbach array. In this case, the permanent magnet segment A, the permanent magnet segment B, the permanent magnet segment C, the permanent magnet segment D, the permanent magnet segment E, the permanent magnet segment F, the permanent magnet segment G and the permanent magnet segment H, which constitute the first and second permanent magnet arrays, are mixedly assembled to form a cylindrical shape in the two-dimensional Halbach array, so that the first permanent magnet array 21 and the second permanent magnet array 31 can be configured in the same structure. In addition, six first coil segment form one set and six second coil segments form one set in the front, rear, left and right directions of a two-dimensional pattern, and then the coil segments of each set are mixedly arranged in a two-dimensional pattern to take an arcuate shape, so that the first permanent magnet array 21 and the second permanent magnet array 31 can be configured in the same structure. In this case, the first and second permanent magnet arrays are correspondingly coupled to the first and second movers for their mutual assembly, and the first and second coil arrays are correspondingly coupled to the first and second stators for their mutual assembly.

The magnetic levitation sections including the permanent magnet arrays and the coil arrays corresponding to the permanent magnet arrays, which are arranged to form the two-dimensional Halbach array, can simultaneously generate the levitation force acting in a vertical direction relative to an axis of the cylindrical substrate, the rotational force acting in a rotational direction relative to an axis of the cylindrical substrate and the translation force acting in the axial direction of the cylindrical substrate by the magnetic force generated by the interaction between the respective magnetic fields of the first permanent magnet array 21 and the first coil array 22, as well as can simultaneously generate the levitation force, the translation force and the rotation force by the magnetic force generated by the interaction between the respective magnetic fields of the second permanent magnet array 31 and the second coil array 32.

Figure 5:
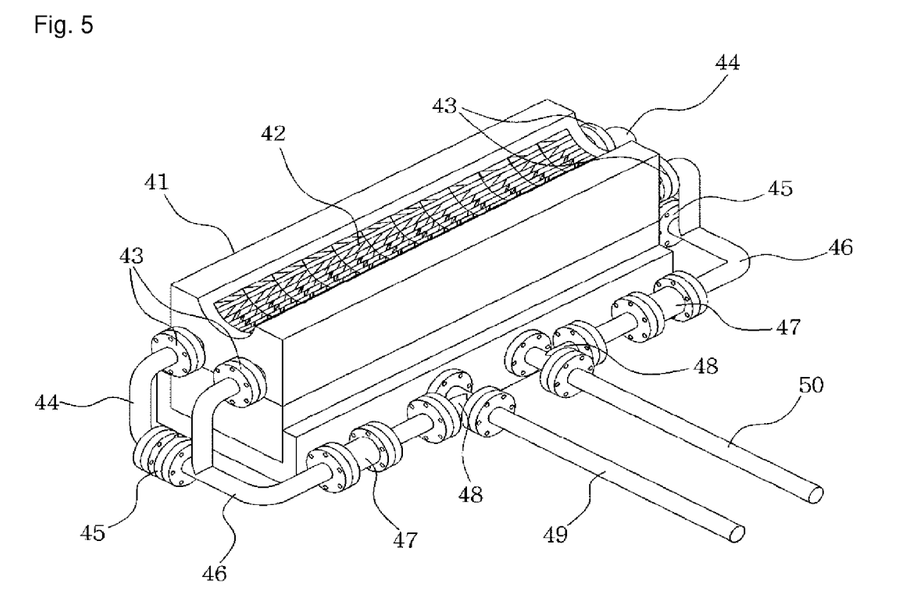
FIG. 5 is a perspective view showing a cooling apparatus of a cylindrical magnetic levitation stage according to the present invention.

FIG. 5 is a perspective view showing a cooling apparatus for cooling the stators in a cylindrical magnetic levitation stage according to the present invention.

As shown in FIG. 5, the cooling apparatus for the cylindrical magnetic levitation stage serves to cooling the stators 41 and 51 through circulation of a refrigerant, and includes a stator, a cooling fin 42, a connecting tube 43, a perpendicularly-bent tube 44, an expansion joint 45 and 47, a T-shaped tube 46, a fixed-type tube 48, a refrigerant inlet tube 49 and a refrigerant outlet tube 50. As shown in FIG. 5, a plurality of cooling fins 42 is arranged at regular intervals on the first stator 41, and the first coil array 22 is insertedly coupled between the cooling fins as shown in FIG. 2. Preferably, the cooling apparatus is configured such that the lateral surface of the first coil array 22 is completely brought into close contact with the lateral surfaces of the cooling fins so as to achieve the sufficient heat exchange between the first coil array and the cooling fins.

When electric current is inputted to the first coil array 22, heat is generated from the first coil array 22 depending on the strength of the electric current. Then, the generated heat is transmitted to the first stator 41 via the cooling fins 42. The cooling tubes including the refrigerant inlet tube 49 and the refrigerant outlet tube 50 shown in FIG. 5 form a single refrigerant circulating loop together with the cooling tubes 25 formed in the first stator 41 shown in FIG. 1 or 2 so as to allow the refrigerant to be circulated while absorbing/emitting the heat transmitted to the first stator 41. Thus, the referent introduced into the cooling apparatus through the refrigerant inlet tube performs the heat exchange with the first stator 41 through the cooling tubes, and then is emitted to the outside through the refrigerant outlet tube.

Moreover, the cylindrical magnetic levitation stage of the present invention may be configured such that the first stator 41 is moved so as to implement an automated operation. In case where there occurs any movement of the first stator 41, a fixed-type bent tube is coupled to the first stator to maintain perpendicularity and parallelism between the refrigerant inlet tube/the refrigerant outlet tube and the first stator so as to so as to prevent introduction of air according to vacuum leak and achieve maintenance of a vacuum state in a work environment.

With regard to the second stator 51 of the cylindrical magnetic levitation stage of the present invention, the cooling apparatus of the present invention may be configured to absorb/emit the heat generated from the second stator 51 and the second coil array 32 by implementing a cooling apparatus including a refrigerant circulating loop having the same structure as that of the above-mentioned refrigerant circulating loop.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A cylindrical magnetic levitation stage comprising:
a cylindrical substrate;
a first cylindrical substrate holder and a second cylindrical substrate holder coupled to both ends of the cylindrical substrate;
a first mover and a second mover to which a first permanent magnet array and a second permanent magnet array are coupled, respectively;
a first coupling section and a second coupling section for connecting the first and second movers to the first and second cylindrical substrate holders, respectively, so as to allow the first mover and the first cylindrical substrate holder to be operated in cooperation with each other and the second mover and the second cylindrical substrate holder to be operated in cooperation with each other; and a first stator and a second stator disposed below the first permanent magnet array and the second permanent magnet array, respectively, with a first coil array and a second coil array interposed between the first and second permanent magnet arrays and the first and second stators, respectively.

2. The cylindrical magnetic levitation stage according to claim 1, wherein the first cylindrical substrate holder and the second cylindrical substrate holder can be coupled to and separated from both ends of the cylindrical substrate.

3. The cylindrical magnetic levitation stage according to claim 1, wherein the first permanent magnet array and the second permanent magnet array are attached along the cylindrical surfaces of the first mover and the second mover, respectively.

4. The cylindrical magnetic levitation stage according to claim 1, wherein when an arbitrary external force is applied to the first permanent magnet array and the second permanent magnet array, it is sequentially transferred to the first mover and the second mover, the first coupling section and the second coupling section, the first cylindrical substrate holder and the second cylindrical substrate holder, and the cylindrical substrate, respectively, in this order so that the cylindrical substrate can be finely fed and rotate.

5. The cylindrical magnetic levitation stage according to claim 1, wherein when electric current is inputted to the first coil array and the second coil array, a magnetic field is generated from each of the surfaces of the first coil array and the second coil array so that a magnetic force is generated by an interaction between the generated magnetic field and the magnetic field generated from each of the first permanent magnet array and the second permanent magnet array, and a generated magnetic force is controlled to be applied to the first permanent magnet array and the second permanent magnet array.

6. The cylindrical magnetic levitation stage according to claim 5, wherein when the generated magnetic force is controlled, the first permanent magnet array and the second permanent magnet array are levitated in a non-contact manner so as to effect a fine axial translation and rotation of the first permanent magnet array and the second permanent magnet array.

7. The cylindrical magnetic levitation stage according to claim 1, wherein a magnetic force generated by an interaction between the magnetic fields of the first permanent magnet array and the first coil array generates a levitation force acting in a vertical direction relative to an axis of the cylindrical substrate and a rotational force acting in a rotational direction relative to the axis of the cylindrical substrate.

8. The cylindrical magnetic levitation stage according to claim 1 wherein a magnetic force generated by an interaction between the magnetic fields of the second permanent magnet array and the second coil array generates a levitation force acting in a vertical direction relative to an axis of the cylindrical substrate and the translation force acting in an axial direction of the cylindrical substrate.

9. The cylindrical magnetic levitation stage according to claim 1, wherein interactions between a respective magnetic fields of the first permanent magnet array and the second permanent magnet array and the respective magnetic fields of the first coil array and the second coil array generate a levitation force acting in a vertical direction relative to an axis of the cylindrical substrate between the permanent magnet arrays and the coil arrays, a rotational force acting in a rotational direction relative to the axis of the cylindrical substrate, and a translation force acting in the axial direction of the cylindrical substrate.

10. The cylindrical magnetic levitation stage according to claim 9, wherein the levitation, the rotation and the translation of the cylindrical substrate can be finely effected in a non-contact manner using the levitation force, the rotational force and the translation force generated by the interactions between the first permanent magnet array and the second permanent magnet array and the first coil array and the second coil array.

11. The cylindrical magnetic levitation stage according to claim 1, wherein the first permanent magnet array is formed in a cylindrical shape while forming a "Halbach array" consisting of a row of bar-like permanent magnet segments having different four magnetization directions, a permanent magnet segment A, a permanent magnet segment B, a permanent magnet segment C, and a permanent magnet segment D.

12. The cylindrical magnetic levitation stage according to claim 11, wherein the first permanent magnet array formed in the cylindrical shape is attached along the cylindrical surface of the first mover.

13. The cylindrical magnetic levitation stage according to claim 1, wherein the first coil array is configured such that first coil segments each having a magnetic field-generating surface of a planar shape are arranged in an arcuate shape.

14. The cylindrical magnetic levitation stage according to claim 1, wherein an interaction between the respective magnetic fields generated from the first permanent magnet array and the first coil array generates a levitation force acting in a vertical direction relative to an axis of the cylindrical substrate and the rotational force acting in a rotational direction relative to the axis of the cylindrical substrate, and the cylindrical substrate can be levitated and rotate finely by using the generated levitation force and rotational force.

15. The cylindrical magnetic levitation stage according to claim 1, wherein the second permanent magnet array is formed in a cylindrical shape while forming a "Halbach array" consisting of a row of arcuate-shaped permanent magnet segments having different four magnetization directions, a permanent magnet segment E, a permanent magnet segment F, a permanent magnet segment G, and a permanent magnet segment H.

16. The cylindrical magnetic levitation stage according to claim 15, wherein the second permanent magnet array formed in the cylindrical shape is attached along the cylindrical surface of the second mover.

17. The cylindrical magnetic levitation stage according to claim 1, wherein the second coil array is configured such that second coil segments each having a magnetic field-generating surface of an arcuately-concaved shape are arranged in an arcuate shape.

18. The cylindrical magnetic levitation stage according to claim 1, wherein an interaction between the respective magnetic fields generated from the second permanent magnet array and the second coil array generates the levitation force acting in a vertical direction relative to an axis of the cylindrical substrate and a translation force acting in an axial direction of the cylindrical substrate, and the cylindrical substrate can be levitated and fed finely by using the generated translation force.

19. The cylindrical magnetic levitation stage according to claims 11 or 15, wherein the permanent magnet segment A, the permanent magnet segment B, the permanent magnet segment C, the permanent magnet segment D, the permanent magnet segment E, the permanent magnet segment F, the permanent magnet segment G and the permanent magnet segment H, which constitute the first permanent magnet array and the second permanent magnet array, are mixedly assembled to form a cylindrical shape in the two-dimensional Halbach array, so that the first permanent magnet array and the second permanent magnet array can be configured in the same structure.

20. The cylindrical magnetic levitation stage according to claim 19, wherein the first permanent magnet array is attached along the cylindrical surface of the first mover, and the second permanent magnet array is attached along the cylindrical surface of the second mover.

21. The cylindrical magnetic levitation stage according to claim 19, wherein the first coil array and the second coil array are configured such that six first coil segments form one set and six second coil segments form one set, and then the coil segments of each set are mixedly arranged in a two-dimensional pattern to take an arcuate shape.

22. The cylindrical magnetic levitation stage according to claim 19, wherein the magnetic force generated by an interaction between the respective magnetic fields of the first permanent magnet array and the first coil array simultaneously generates the levitation force acting in a vertical direction relative to an axis of the cylindrical substrate, a rotational force acting in a rotational direction relative to an axis of the cylindrical substrate and a translation force acting in the axial direction of the cylindrical substrate.

23. The cylindrical magnetic levitation stage according to claim 19, wherein the magnetic force generated by an interaction between the respective magnetic fields of the second permanent magnet array and the second coil array simultaneously generates a levitation force acting in a vertical direction relative to an axis of the cylindrical substrate, a rotational force acting in a rotational direction relative to an axis of the cylindrical substrate and a translation force acting in the axial direction of the cylindrical substrate.

24. The cylindrical magnetic levitation stage according to claim 1, further comprising a cooling apparatus, the cooling apparatus comprising: a cooling fin disposed on the first stator for performing a heat exchange; and a refrigerant circulating loop including a cooling tube mounted inside the first stator, a refrigerant inlet tube and a refrigerant outlet tube.

25. The cylindrical magnetic levitation stage according to claim 1, further comprising: a cooling fin disposed on the second stator for performing a heat exchange; and a refrigerant circulating loop including a cooling tube mounted inside the second stator, a refrigerant inlet tube and a refrigerant outlet tube.

26. The cylindrical magnetic levitation stage according to claim 1, wherein a plurality of cooling fins is arranged at regular intervals on the first stator or the second stator, the first coil array or the second coil array is insertedly coupled between the cooling fins, and the first coil array or the second coil array is bonded to the cooling fins such that a lateral surface of the first coil array or the second coil array is brought into close contact with the lateral surfaces of the cooling fins.

27. The cylindrical magnetic levitation stage according to claims 24, wherein when electric current is inputted to the first coil array or the second coil array, heat is generated from the first coil array or the second coil array depending on a strength of a current and is transmitted to the first stator or the second stator via the cooling fins.

28. The cylindrical magnetic levitation stage according to claim 27, wherein a rise in temperature of the first or second stator and the first or second coil array is suppressed as the heat transmitted to the first stator is emitted along with a flow of the refrigerant through the cooling tubes formed in the first stator or the second stator.

29. The cylindrical magnetic levitation stage according to claim 24, wherein in case where there occurs any movement of the first stator or the second stator, a fixed-type bent tube is coupled to the first stator to securely fix the refrigerant inlet tube and the refrigerant outlet tube in the refrigerant circulating loop so as to maintain perpendicularity and parallelism between the refrigerant inlet tube, the refrigerant outlet tube and the first stator or the second stator.

30. The cylindrical magnetic levitation stage according to claim 25, wherein when electric current is inputted to the first coil array or the second coil array, heat is generated from the first coil array or the second coil array depending on a strength of a current and is transmitted to the first stator or the second stator via the cooling fins.

31. The cylindrical magnetic levitation stage according to claim 30, wherein a rise in temperature of the first or second stator and the first or second coil array is suppressed as the heat transmitted to the first stator is emitted along with a flow of the refrigerant through the cooling tubes formed in the first stator or the second stator.

32. The cylindrical magnetic levitation stage according to claim 25, wherein in case where there occurs any movement of the first stator or the second stator, a fixed-type bent tube is coupled to the first stator to securely fix the refrigerant inlet tube and the refrigerant outlet tube in the refrigerant circulating loop so as to maintain perpendicularity and parallelism between the refrigerant inlet tube, the refrigerant outlet tube and the first stator or the second stator.

* * * * *